US007035781B1

(12) United States Patent  
Flake et al.

(10) Patent No.: US 7,035,781 B1
(45) Date of Patent: Apr. 25, 2006

(54) MIXED LANGUAGE SIMULATOR

(75) Inventors: Peter Flake, Camberley (GB); Simon Davidmann, Thame (GB); Matthew Hall, Oxford (GB); James Kenney, Didcot (GB)

(73) Assignee: Synopsys, Inc., Mountain View, CA (US)

( * ) Notice: Subject to any disclaimer, the term of this patent is extended or adjusted under 35 U.S.C. 154(b) by 757 days.

(21) Appl. No.: 09/752,642

(22) Filed: Dec. 29, 2000

Related U.S. Application Data

(60) Provisional application No. 60/173,862, filed on Dec. 30, 1999, provisional application No. 60/196,225, filed on Apr. 10, 2000.

(51) Int. Cl.
*G06F 17/50* (2006.01)
(52) U.S. Cl. .............................. 703/14; 703/1; 703/13; 716/1; 716/12; 716/16
(58) Field of Classification Search .................... 703/1, 703/13–14; 716/1–18
See application file for complete search history.

(56) References Cited

U.S. PATENT DOCUMENTS

| 5,493,507 A  * | 2/1996 | Shinde et al. ................. 703/14 |
| 5,600,579 A  * | 2/1997 | Steinmetz, Jr. ............... 703/13 |
| 6,226,780 B1 * | 5/2001 | Bahra et al. .................. 716/18 |
| 6,230,114 B1 * | 5/2001 | Hellestrand et al. .......... 703/13 |
| 6,230,307 B1 * | 5/2001 | Davis et al. .................. 716/16 |
| 6,466,898 B1 * | 10/2002 | Chan ........................... 703/17 |

OTHER PUBLICATIONS

Microsoft Press Computer Dictionary, Third Edition, definition of the word "thread".*
A mixed-Language Simulator for Concurrent Engineering; Burgoon et al; Mar. 1998; Verilog HDL Conference 1998.*
Simon Davidmann, Peter Flake, and David Kelf. Measuring Design Language Options For System-On-Chip Design. May 21, 1999. Pp. 1-11. 1999 Co-Design Automation, Inc.

(Continued)

*Primary Examiner*—Anthony Knight
*Assistant Examiner*—Ronald D Hartman, Jr.
(74) *Attorney, Agent, or Firm*—Park, Vaughan & Fleming, LLP

(57) ABSTRACT

An HDL simulator having an automated interface to compiled or interpreted application code written in a general purpose language. The interface enables the HDL code to have a direct data access to and from the application code. The simulator automatically maps and converts HDL data types to and from programming language data types, such as the arguments of routine calls or direct data accesses. Further, the simulator provides a programming language calling mechanism and automatically does data type mapping of arguments, which enables the HDL to call application code routines compiled with a standard compiler, and enables such routines to call functions in the HDL. The simulator automatically generates wrappers for the interface which automatically map data types for direct data access when the application code is compiled, and can output messages upon the occurrence of calls or returns. The automatically generated wrappers also provide automatic threading, which enables compiled application code to call tasks in the HDL.

10 Claims, 19 Drawing Sheets

OTHER PUBLICATIONS

Co-Design, The Language Specialists. Superlog. 1999. Pp. 1-15. 1999 Co-Design Automation, Inc.

Superlog, the Elegance of Verilog, the Power of C. 1999, Pp. 1-2. Co-Design Automation, Inc.

News Release: Co-Design Unveils Breakthrough Design Language Technology Targeting System-On-Chip Methodology Needs. Pp. 1-5. May 31, 1999 Co-Design Automation, Inc.

* cited by examiner

MIXED LANGUAGE SIMULATOR

This application claims the benefit of U.S. Provisional Application No. 60/173,862, entitled "Mixed Language Simulation Environment," filed on Dec. 30, 1999, and of U.S. Provisional Application No. 60/196,225, entitled "Mixed Language Simulation Environment," filed on Apr. 10, 2000, the subject matter of which is incorporated herein by reference.

BACKGROUND OF THE INVENTION

1) Technical Field

This invention relates to using a hardware description language (HDL) such as Verilog or VHDL in conjunction with a conventional programming language such as C, C++ or for performing the logical simulation of digital electronic systems.

2) Discussion of the Prior Art

Hardware design or verification engineers modeling a complex digital system often find that different modeling languages have both strengths and weaknesses in implementing the desired model. For example, an HDL, such as Verilog, may be well suited for describing specific hardware structures and behaviors, while a conventional programming language, such as C, would complement the HDL by providing more abstract system-related functions and algorithms. Consequently, it is often desirable to integrate an HDL and a conventional programming language in order to model a complex digital system.

At the same time, the fact that two very different languages are used together for modeling means that any inherent differences between the two modeling languages must be accommodated. One of the differences between an HDL and a programming language is that the concept of simulated time is built into the HDL, while simulated time is not provided in a conventional programming language. The logical HDL simulation takes a number of time steps, while the conventional programming language does not. Partial accommodation of these differences and communication between these languages is most commonly provided by a Programming Language Interface (PLI).

The Institute of Electrical and Electronic Engineers (IEEE) standard 1364 defines both the PLI and the Verilog HDL. The PLI, illustrated in FIG. 1, provides table-based mapping of function names between Verilog and C, and a set of simulator routines that can be called from C to read and write the arguments. The PLI interface code, the PLI access library and the indirection lookup table provide indirect links between the user application programming language code and the HDL simulator. Such PLI programming is complex, difficult to learn, and inappropriate for simple applications. VHDL has a similar kind of interface called the Foreign Language Interface (FLI). Hereafter, the acronym PLI will be used to include both the PLI and the FLI language interfaces.

Many programming language considerations are involved in forming a combination of an HDL and a conventional programming language. Programming languages and HDLs can be compiled or interpreted. A compiler converts language source code into object code for a particular machine. This is often used for languages like C++. An interpreter converts language source code into its own data format, which is then executed. This is often used for languages like PERL. An HDL simulator can use either technique or both, and may use special-purpose hardware to accelerate the simulation. Accordingly, an environment that uses combinations of such languages must provide for compiled, interpreted or accelerated versions on either side of the modeling interface.

Another consideration is that object code can be made 'shared' so that one or more programs can link to it while running. The linking applies to both routine calls and variables. The PLI does not provide direct sharing of user-defined variables, but only via routines to access the names used in calls from the HDL, as illustrated in FIG. 2.

HDLs distinguish between HDL functions and Verilog tasks or VHDL procedures. The Verilog term 'task' is used in this document hereafter to include the very similar VHDL term 'procedure.' HDL functions cannot have a simulation time duration, while Verilog tasks can have timing and event controls and so take simulation time. In either Verilog or VHDL, expressions can be function calls, but expressions cannot be task calls.

The Verilog PLI currently requires calls and returns to be in the same simulator time step, thus requiring that all C code routines execute in one time step. Furthermore, in the current Verilog PLI, the arguments must be accessed from the programming language by routine calls, as illustrated in FIG. 3.

For a complete model of C software controlling hardware, such as in an embedded system simulation, the C control code must be able to interact with a Verilog simulation of the hardware so that the control code can make a call to an HDL task during a simulator time step, and the call does not return to the control code until one or more simulator time steps later. This is not supported in the IEEE 1364 standard. One approach is to keep the C control code and the Verilog simulation as different programs, communicating by Unix facility known as a 'socket'. Some users have implemented socket interfaces to provide this functionality, even for testbench applications. This is even slower and more complex than using the PLI, and its use has been primarily in so-called "co-verification" products.

To allow concurrency in general programming languages, there are 'threads' packages available in the public domain. Each 'thread' represents a sequence that can run concurrently with other threads. In practice each thread executes part of its sequence, then waits for another thread to execute, and so on. Each wait involves saving the stack, so it can be restored later. These thread packages are hard to learn and use.

There remains, therefore, a need for a simulator that makes the interface between HDLs and programming languages easy to use, automatic and fast.

SUMMARY OF THE INVENTION

Therefore, it is an object of the present invention to provide an automated interface between HDLs and programming languages, in particular Verilog and C.

It is another object to facilitate an HDL calling routines and accessing data declared in a programming language, and vice-versa.

It is yet another object to provide an improved interface between HDLs and programming languages.

The invention achieves these and other objects by providing an HDL simulator, which uses either compiled or interpreted HDL code, and comprises an automated interface to compiled or interpreted application code written in a general purpose programming language. The interface enables the HDL code to have a direct data access to and from the application code. The simulator automatically maps and converts HDL data types to and from programming language data types, such as the arguments of routine calls or direct data accesses. Further, the simulator provides a programming language calling mechanism and automatically does data type mapping of arguments, which enables the HDL to call application code routines compiled with a standard compiler, and enables such routines to call functions in the HDL. The simulator automatically generates wrappers for the interface which automatically map data types for direct data access when the application code is compiled, and can output messages upon the occurrence of calls or returns. The automatically generated wrappers also provide automatic threading, which enables compiled application code to call tasks in the HDL.

These and other advantages and benefits of the invention will be apparent upon reading the following Detailed Description.

DETAILED DESCRIPTION OF THE PREFERRED EMBODIMENT

The present invention provides a mixed language simulator, referred to herein as a 'blending simulator.' which blends one or more HDLs with one or more conventional programming languages in an integrated programming environment. The blending simulator allows code to be read and integrated from a number of language sources, including HDLs, programming languages and linked shared objects from programming languages. The blending simulator is a substantial improvement over using PLI between Verilog and C or C++, for example.

Figure 1:
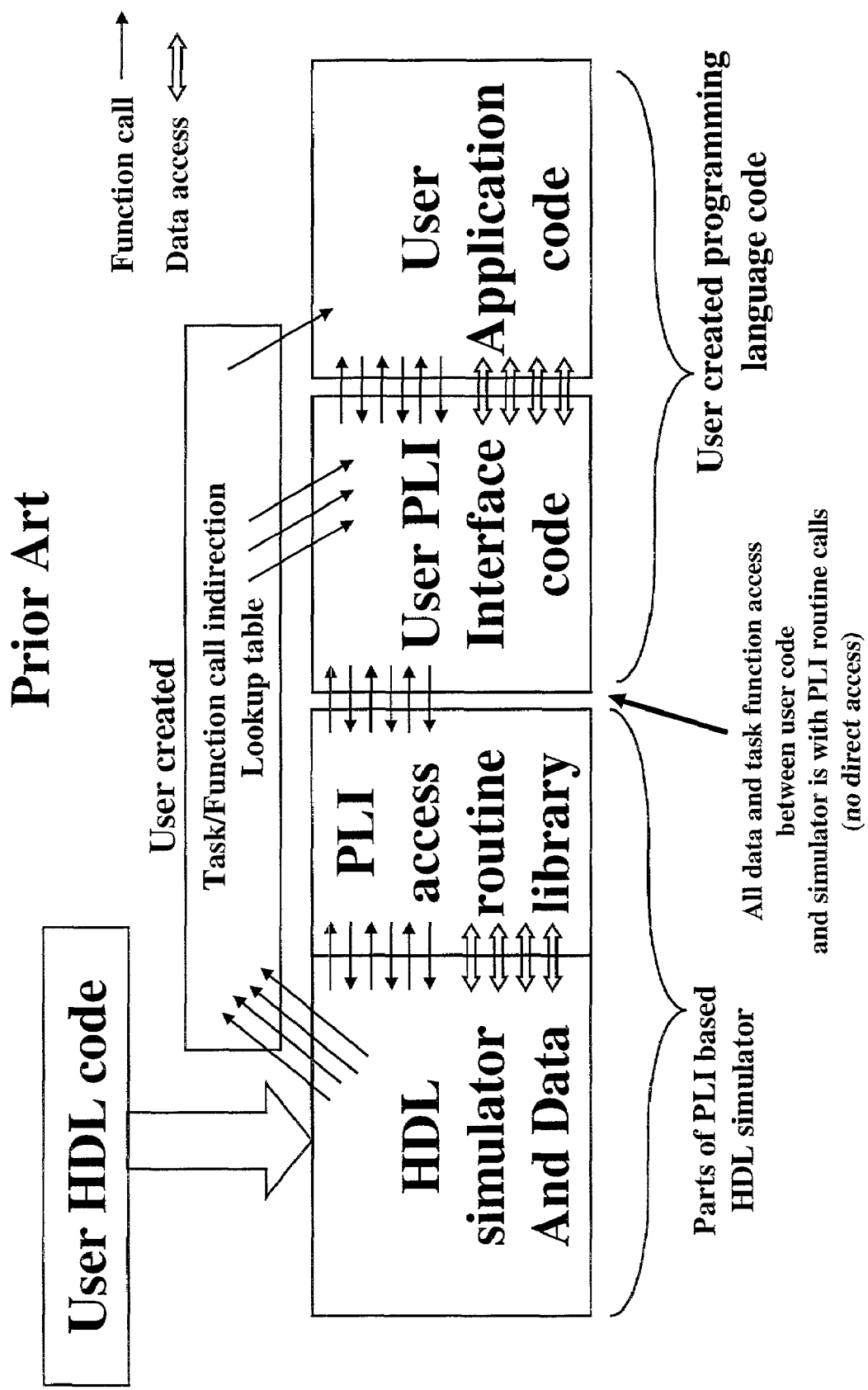
FIG. 1 is an overview of a prior art PLI-based simulator.
Figure 2:
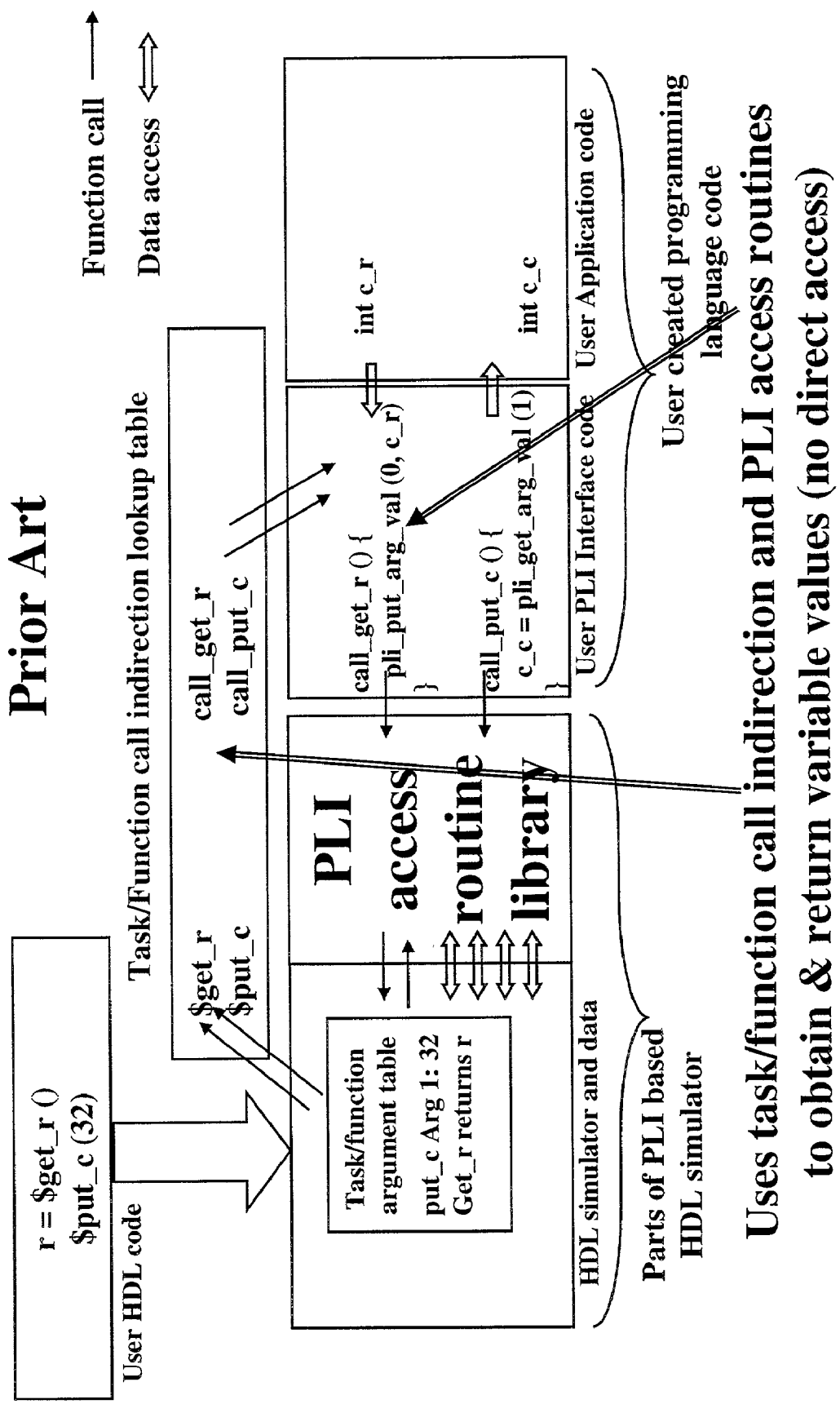
FIG. 2 shows HDL calling a programming language function and passing arguments in a prior art PLI based simulator.
Figure 3:
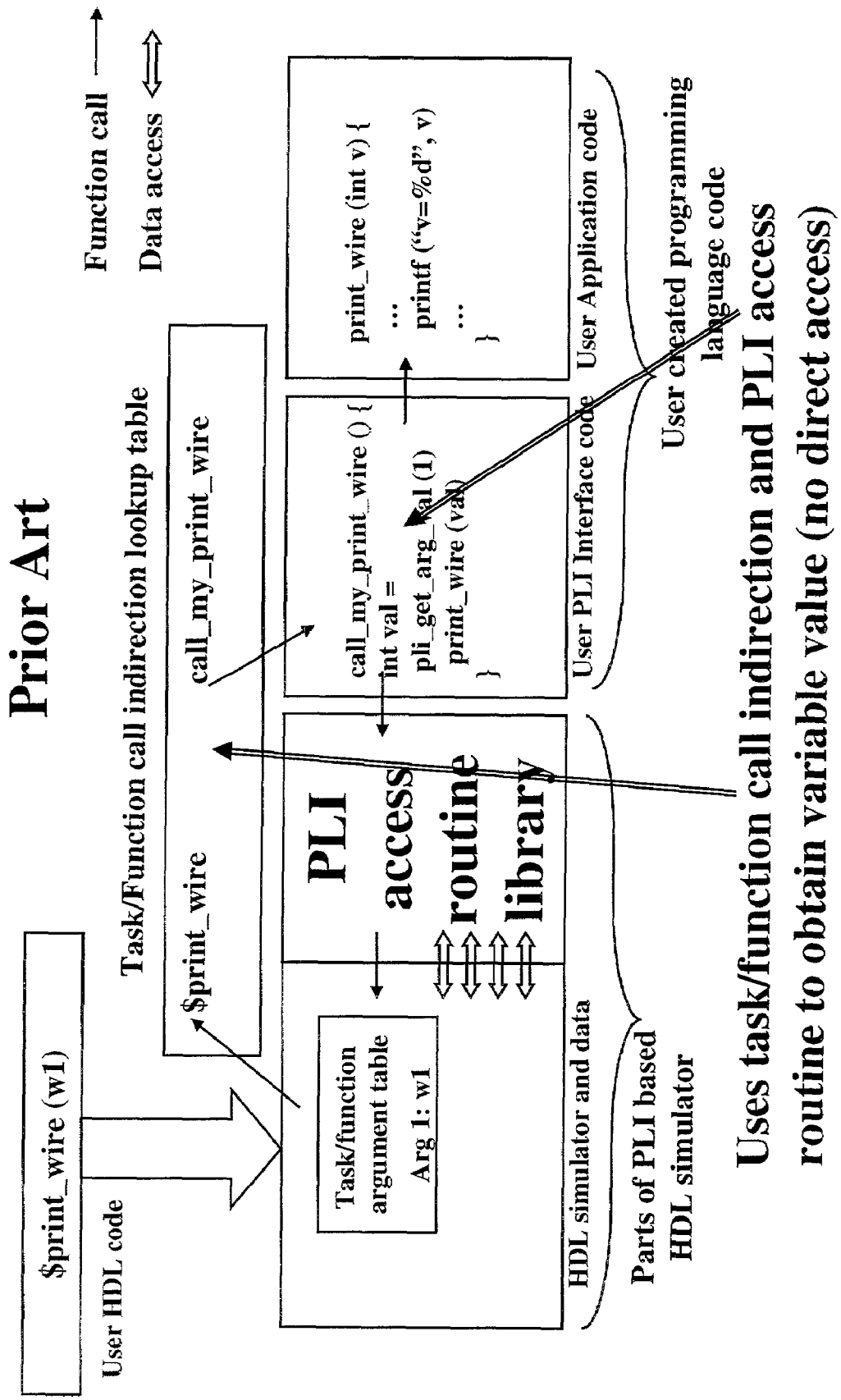
FIG. 3 illustrates an HDL accessing programming language variables in a prior art PLI based simulator.
Figure 4:
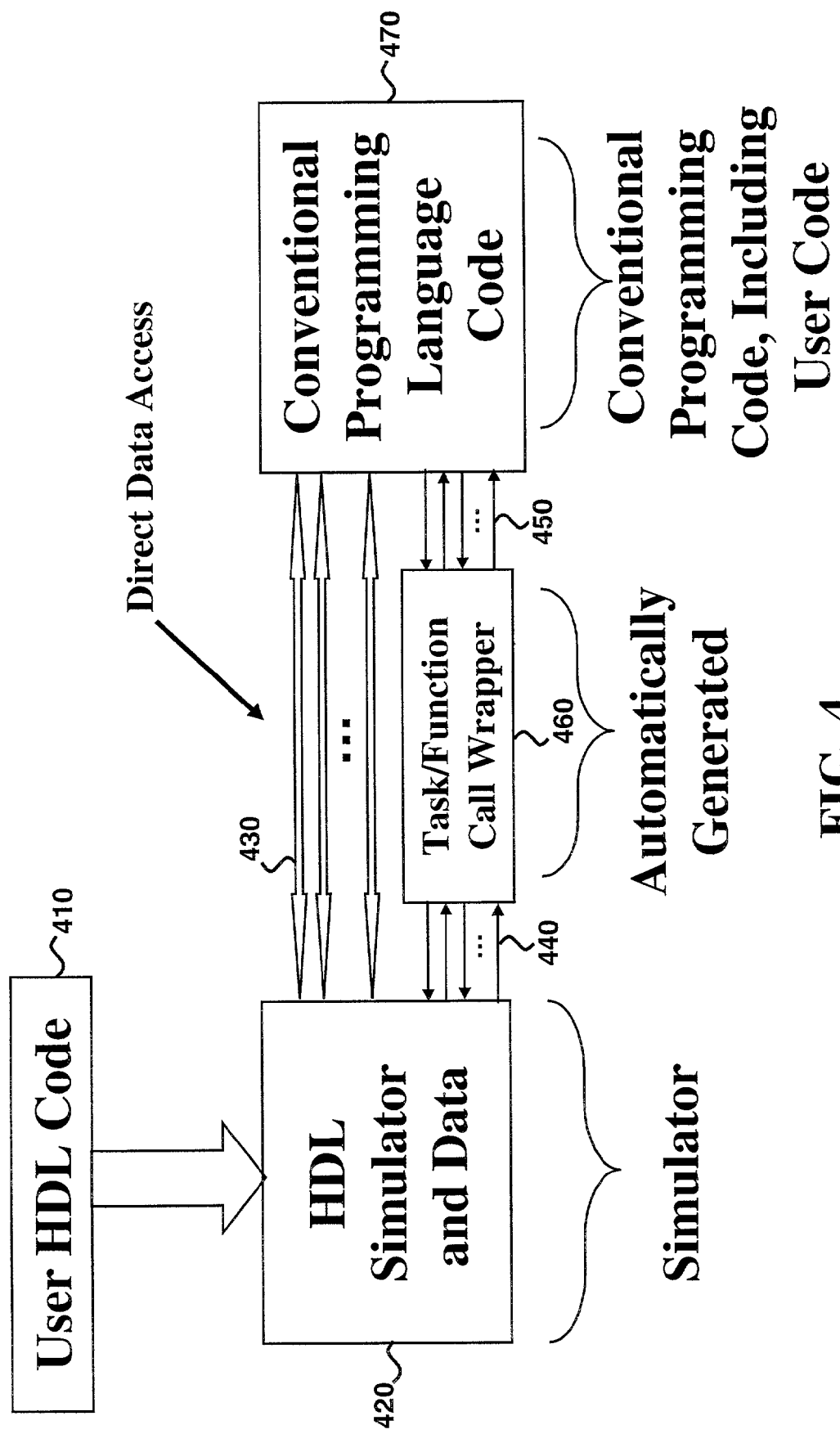
FIG. 4 is an overview of the blending simulator of the invention.

The blending simulator, shown in FIG. 4, allows direct calling between an HDL, such as compiled or interpreted Verilog, and a compiled or interpreted programming language. This eliminates the need for users to program their own interfaces using PLI. The user HDL code 410 runs on the HDL simulator and data subsystem 420. User application code 470 may interact directly with the HDL simulator and data subsystem 420 through direct data access means 430. The task or function call wrapper subsystem 460 interfaces with the HDL simulator and data subsystem 420 through the call and return paths 440 and also interfaces with the user application code 470 through the call and return paths 450. The necessary wrappers are provided automatically in the task or function call wrapper system 460. The conventional programming language code 470 may be compiled by a standard compiler without reference to the blending simulator. The user HDL code 410 is compiled or interpreted by the blending simulator, which may use special-purpose hardware to accelerate the HDL simulation.

Blending Simulator Modeling Improvements

In some types of digital design, using a conventional programming language is sometimes preferred to HDL for preliminary modeling or design specification purposes because a conventional programming language is often more suitable or more efficient for developing or evaluating new or more abstract aspects of the design. An example of using of a conventional programming language in the context of the blending simulator is the use of an executable specification. An executable specification is a set of routines written in a programming language that describe a desired behavior of the design without reference to timing or implementation details. The executable specification might be a conventional programming language model that the HDL code being evaluated was based on, or might be an adaptation of it. It is very desirable to be able to use an executable specification to perform automated evaluations of the HDL model.

Figure 5:
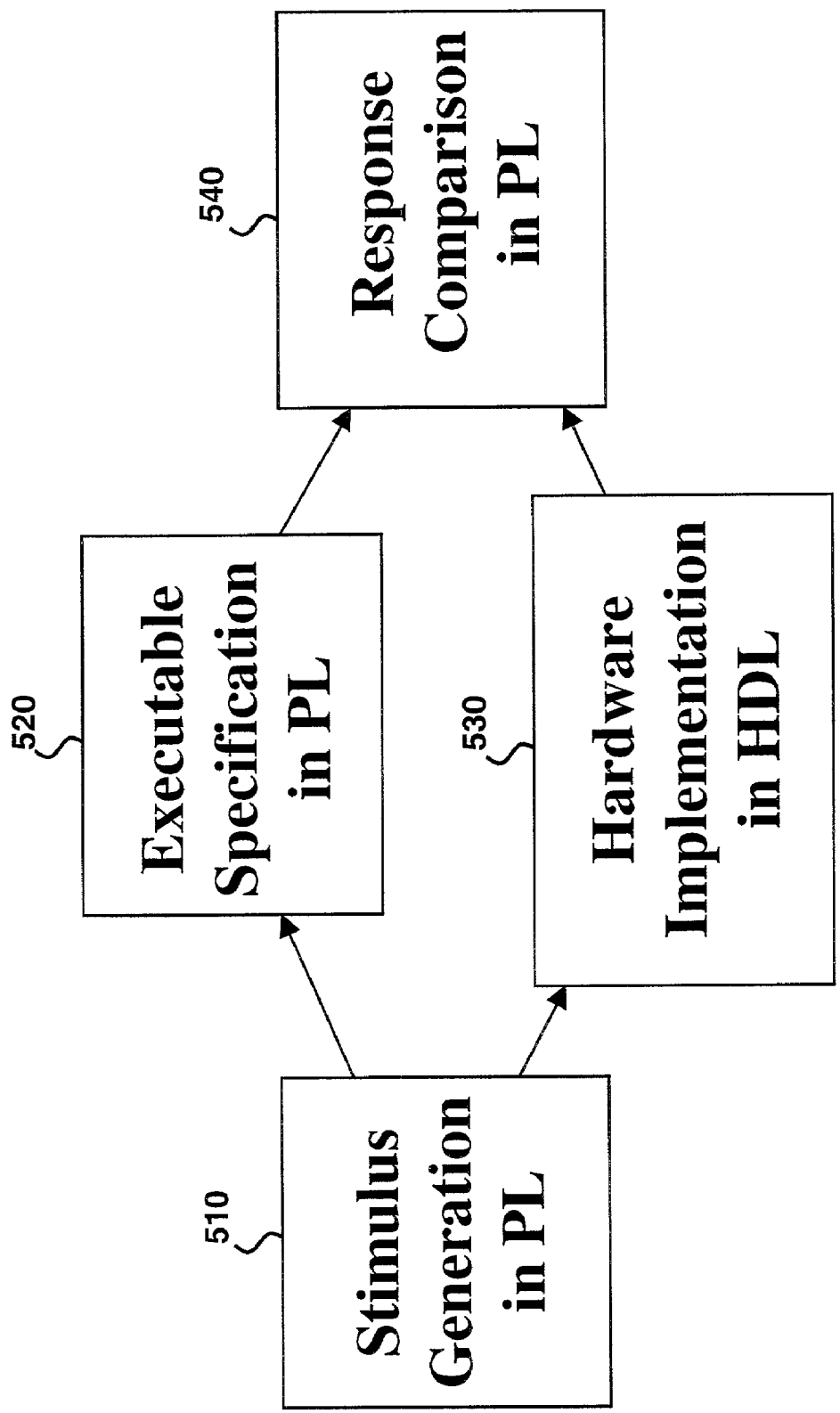
FIG. 5 is a diagram of a comparison of a hardware implementation with an executable specification.

The blending simulator adds substantial improvements over prior art approaches, such as the PLI and sockets, for the purpose of performing automated comparisons of HDL models with an executable specification. In FIG. 5, a stimulus generator 510, an executable specification 520 and a response comparison 540 are implemented in conventional programming language code, while the hardware implementation 530 to be evaluated is written in HDL code. The stimulus generator 510 drives both the executable specification 520 and the hardware implementation 530.

The responses of the hardware implementation 530 are compared with the executable specification 520, and any differences are reported to the user by response comparison 540. Such modeling evaluations would be inefficient and difficult to implement for many types of executable specifications using prior art approaches.

As another illustration of how the blending simulator might be used, consider the modeling a system that includes hardware and software, known as an "embedded system". Hereafter, the phrase "embedded system" shall include any system containing hardware and software. Modeling embedded systems requires excellent integration between portions of the model implemented in HDL code, such as digital hardware, and the other parts of the model implemented in a conventional programming language, such as the embedded system software. The verification of the hardware with the software is known as "co-verification", and in the prior art uses PLI and sockets.

Figure 6:
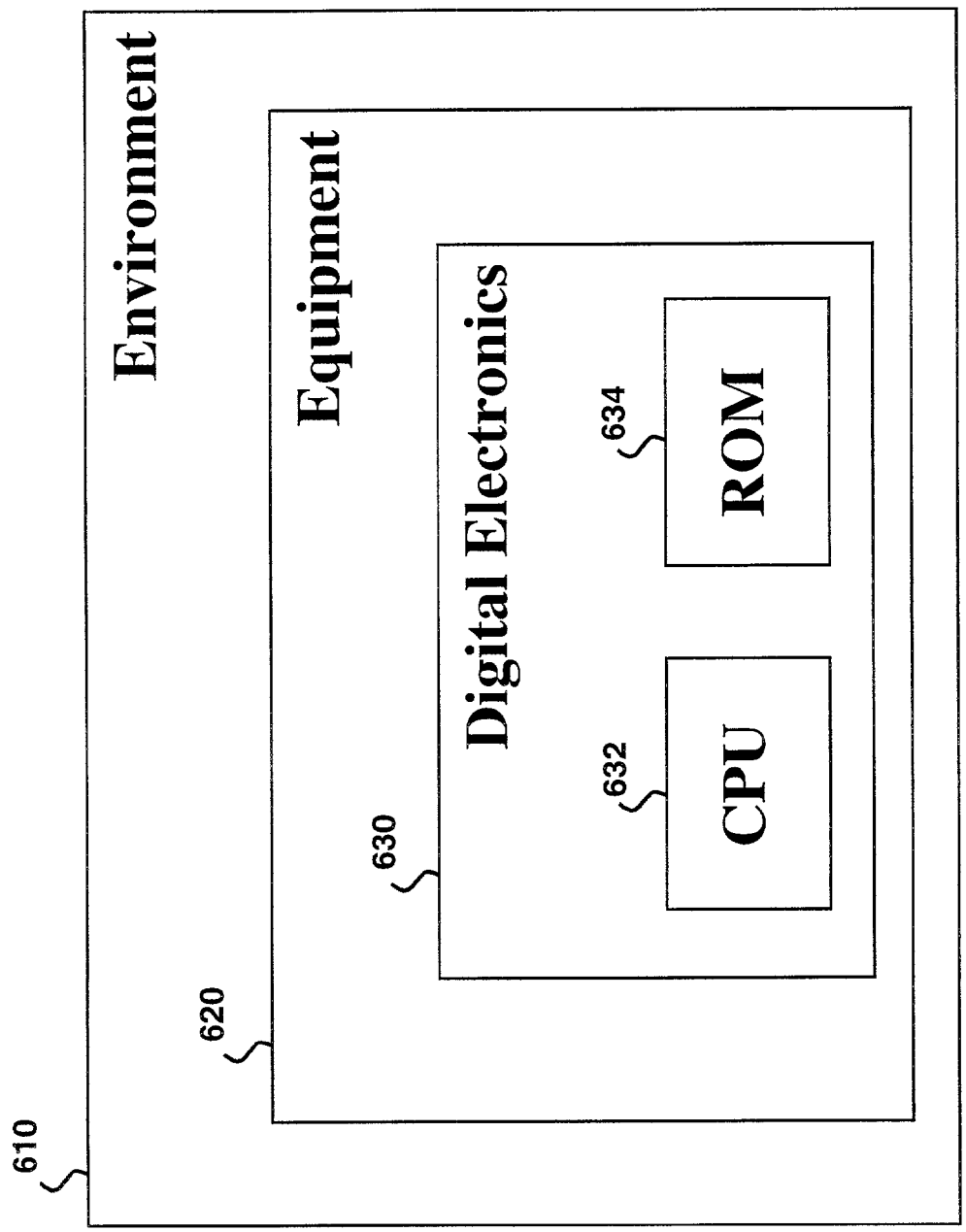
FIG. 6 is a diagram of an embedded system.

FIG. 6 illustrates the physical hierarchy levels of an embedded system. The physical hierarchy consisting of an environment level 610, which is external to the equipment being modeled, an equipment level 620, and a digital electronics level 630. Digital electronics level 630 includes embedded digital subsystems, such as a processor 632 and a ROM 634 that contains software.

Figure 7:
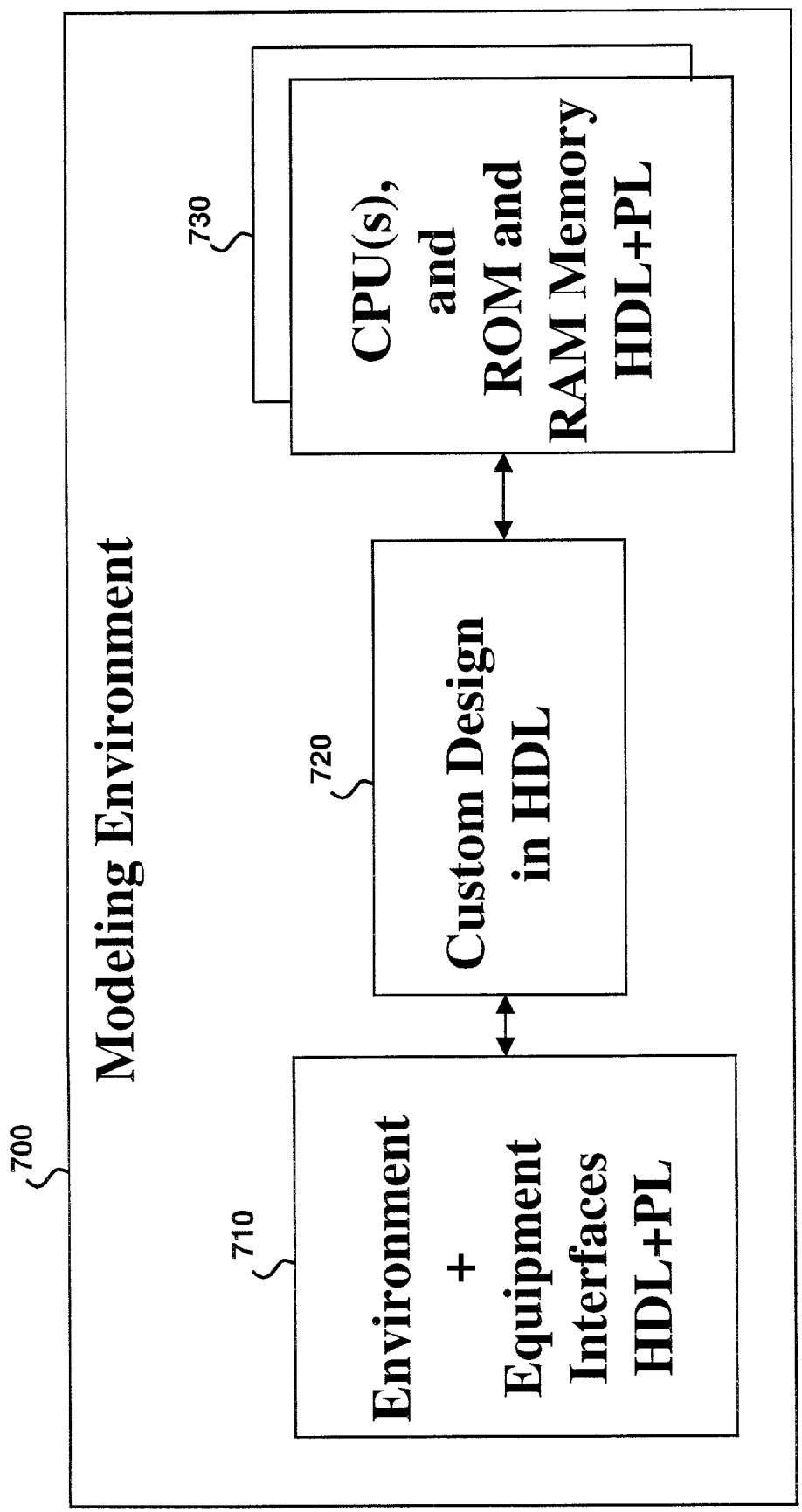
FIG. 7 is a digital electronic designer's view of an embedded system.

A blending simulator facilitates the modeling of the embedded system hierarchy of FIG. 6 in a number of ways. FIG. 7 illustrates the blending simulator metaphor for modeling the embedded system as seen from the hardware designer's point of view. The modeling environment 700 uses the blending simulator to integrate the different portions of modeling code comprising the embedded system model. An environment and equipment interfaces (EEI) subsystem 710 models the system input and output, such as system user controls and interactions with external systems. Modeling in the EEI subsystem 710 may be written and executed in HDL, in a conventional programming language, or a combination of the two languages. HDL modeling in the EEI subsystem 710 would typically be used for simple digital inputs and outputs, and any associated digital interfaces, while a conventional programming language would be used for non-digital or complex input/output data, such as analog signals, complex digital data, network interfaces or communications. Providing conventional programming language capabilities in the EEI subsystem 710 also provides modeling functions, library routines and programming capabilities that are not available for in a purely HDL modeling environment.

Similarly, a processor subsystem 730 may be written and executed in HDL, in a conventional programming language, or a combination of the two languages. Processor subsystem 730 models one or more CPUs, RAM memory, and ROM memory containing the embedded software. Fully modeling the details of processor subsystem 730 purely in HDL is a very complex and time-consuming undertaking because of the inherent complexity and interactions of CPUs, RAM and ROM memory, and the processor operating system. In particular, it usually would be very inefficient to use HDL to model the embedded software and operating system contained in the ROM memory as machine language code. It is much more efficient to simply model all embedded software and operating system aspects in a conventional programming language. Similarly, the CPUs contain millions of gates, and modeling the full complexity of the CPUs using HDL detailed hardware descriptions makes little sense in the context of modeling a complete system, so conventional programming languages are commonly used for this purpose.

Although a conventional programming language is preferred for modeling most of processor subsystem 730, there are some modeling aspects where HDL is highly effective. If, for example, the purpose of creating the model is to study the detailed operation of a relatively small circuit contained in processor system 730, then using the HDL approach for that portion gives good visibility into such performance details, while continuing to model the other portions with a conventional programming language model. Another example is that HDL models of peripheral or interface chips contained in processor subsystem 730 may already exist or not be difficult to write, so the HDL approach may be appropriate for that case. The blending simulator allows the user to choose whichever modeling approach is the most appropriate for the different portions of the model.

The custom design subsystem 720 is written in HDL code and represents the various digital circuits that are neither part of the EEI subsystem 710 nor of the processor subsystem 730, but are intermediate circuitry that provide digital paths and functions between the two subsystems. The circuits in the custom design are modeled in HDL so that other design tools such as logic synthesis can process them.

In executable specification or embedded system modeling, for example, the blending simulator allows the user to use the hardware-related structural and behavioral capabilities of HDL, or the abstract representations or programming capabilities of the conventional programming language, or a mixture of the two, as appropriate. Such modeling of would be inefficient and difficult to implement using prior art approaches, such as PLI.

Blending Simulator Features

The blending simulator provides a smooth interface between languages that are often very different from each other. A logical simulation in HDL takes a number of time steps, and the blending simulator determines and coordinates which statements of the conventional programming language are executed in which time step. It also supports inter-language calling. The blending simulator also provides an automatic multi-threading environment for the programming language without needing explicit calls to a threads package. If the programming language has been compiled into object code, the simulator automatically creates the calls to a threads package. If the programming language is interpreted, the simulator handles the threading itself.

The blending simulator accommodates language type system differences. Some HDLs, such as VHDL, have complex type systems. Others, such as Verilog, have simple type systems. Similarly, programming languages also have type systems. The blending simulator reads the HDL type of each piece of data, and attempts to infer the corresponding programming language type, or checks it against a declaration in the programming language.

Figure 8:
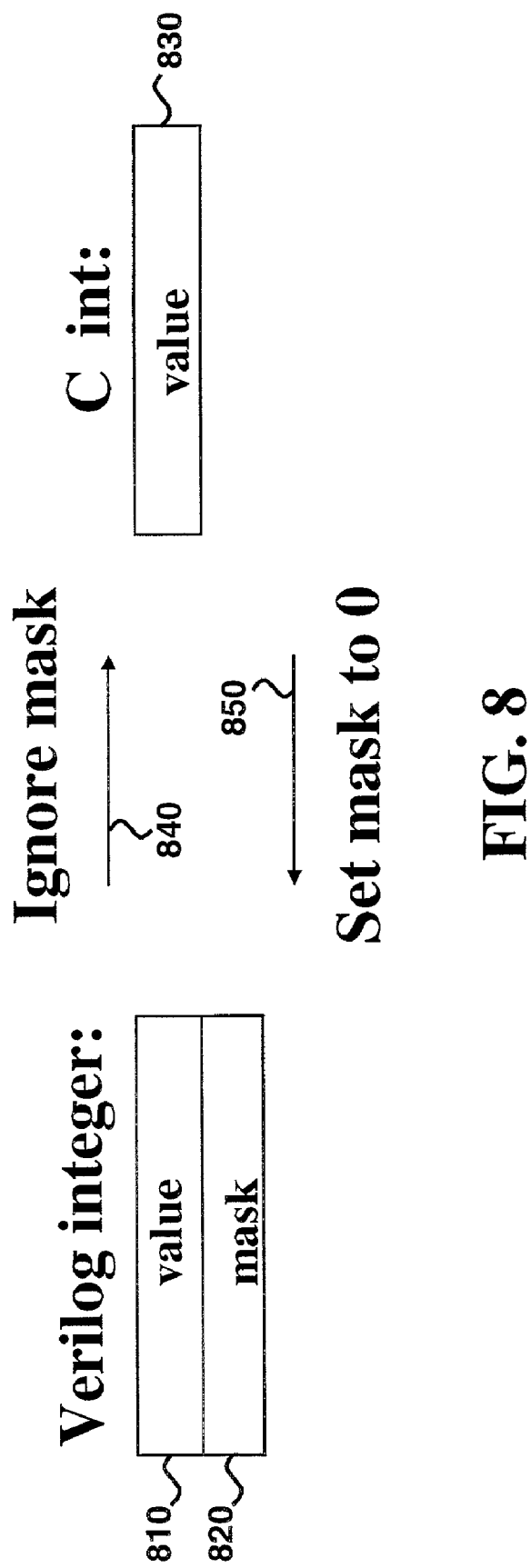
FIG. 8 shows one kind of type mapping.
Figure 9:
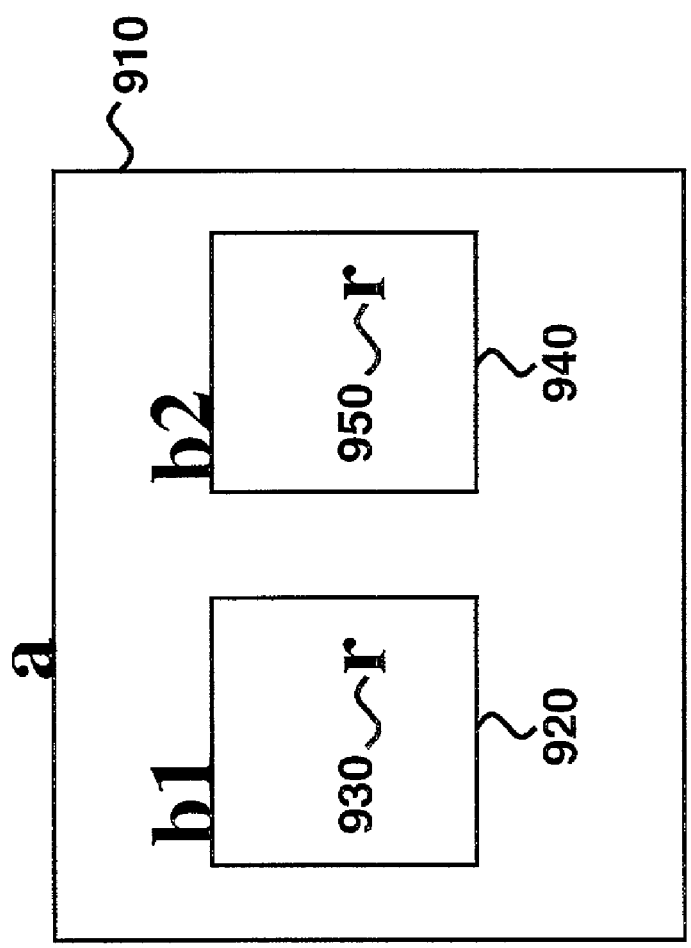
FIG. 9 illustrates name mapping.

FIG. 8 shows one particular kind of type mapping that is encountered when using an HDL with a conventional programming language. Assume, for example, that generic integers need to be mapped in either direction between Verilog and the C language. A declared Verilog integer comprises a value 810 and associated mask bits 820. A corresponding C language declaration of type int consists only of a value 830. Consequently, when the blending simulator maps values from Verilog to C, the mapping operation 840 ignores the mask variables 820, and when mapping values from C to Verilog, the mapping operation 850 sets all mask bits 820 to zero. Programming languages conventionally have a global name space so that independently compiled pieces of code are automatically linked together. On the other hand, some HDLs, such as Verilog and VHDL, lack a global name space for task, function and variable declarations. Consequently, the prior art PLI requires the user to write a separate file to declare all routines that are visible to Verilog, and can only find HDL names from the arguments to the routine calls. The blending simulator provides name-mapping to allow the conventional programming language to refer to a declaration in the HDL. For example, FIG. 9 shows a three-level name space, with a top-level name space 910 labels as 'a.' Name space 910 contains two intermediate level name spaces 920 and 940 which are labeled as 'b1' and 'b2.' Intermediate name space 920 contains a declaration 930 labeled as 'r.' Intermediate name space 940 also has a declaration 950 labeled as 'r.' It is therefore necessary to distinguish between names of similar hierarchical variables such as a.b1.r and a.b2.r. Such declarations always have to be provided in a mapping file for the prior art PLI or if the HDL does not support automatic mapping. However, the blending simulator automatically reads such information directly from HDL versions that permit the mapping to be declared.

HDLs distinguish between tasks and functions. Tasks may have timing controls and so take simulation time, while functions cannot take simulation time. Expressions can be function calls. This distinction must also be applied to conventional programming languages in order to speed up the simulation. The distinction affects the implementation and running time, since a C function stack does not need to be saved because it is created and immediately discarded, whereas a C task stack must be saved at one simulation time and restored at a later simulation time. Since it is difficult to find out whether a programming language routine has a timing control by examining the programming language source or by examining the calling source, and may be impossible if the C has been compiled to shared object, the user must declare a programming language routine to be a task. The blending simulator readily allows for and accommodates these distinctions.

Compiled programming language routines may be called from HDL in two different ways, which are accommodated by the blending simulator. The first way is as "programming language functions": in this case, the compiled routine is called in the main simulation program thread and returns immediately, at which point simulation continues as normal.

The second way is as "programming language tasks": in this case, the compiled programming language routine is run in a separate process thread. This allows programming language control code to drive an HDL simulation without using a socket. The programming language task may call back to HDL tasks which have delay (either explicit or by waiting for an event). At such a point, the task thread is suspended until reawakened by the simulation main thread at an appropriate time. It is illegal for programming language functions to call HDL tasks.

Naming, Data Type and Execution Concurrency

The various languages integrated in the blending simulator in general have different rules for naming, and the user may have to supply additional information to match the names. The user may put such information in HDL declarations with the rest of the description, if the HDL supports this feature, or in a separate file. Another difference between the languages is that they may use data types which are not directly compatible, and the blending simulator provides automatic conversion between them.

The blending simulator has the ability for HDL to look up the name of a function written in the conventional programming language, and to convert the HDL arguments automatically to the appropriate programming language data types, simulate the programming language code, and to convert the return value back to an HDL data type automatically. Furthermore a task written in the programming language can be declared an 'import task' to the blending simulator and this will automatically provide concurrency of execution with other tasks as part of the simulator.

Wrappers

The interface between the compiled programming language and the HDL is by means of interface routines known as "wrappers" that are automatically generated, compiled and linked before simulation.

Figure 10:
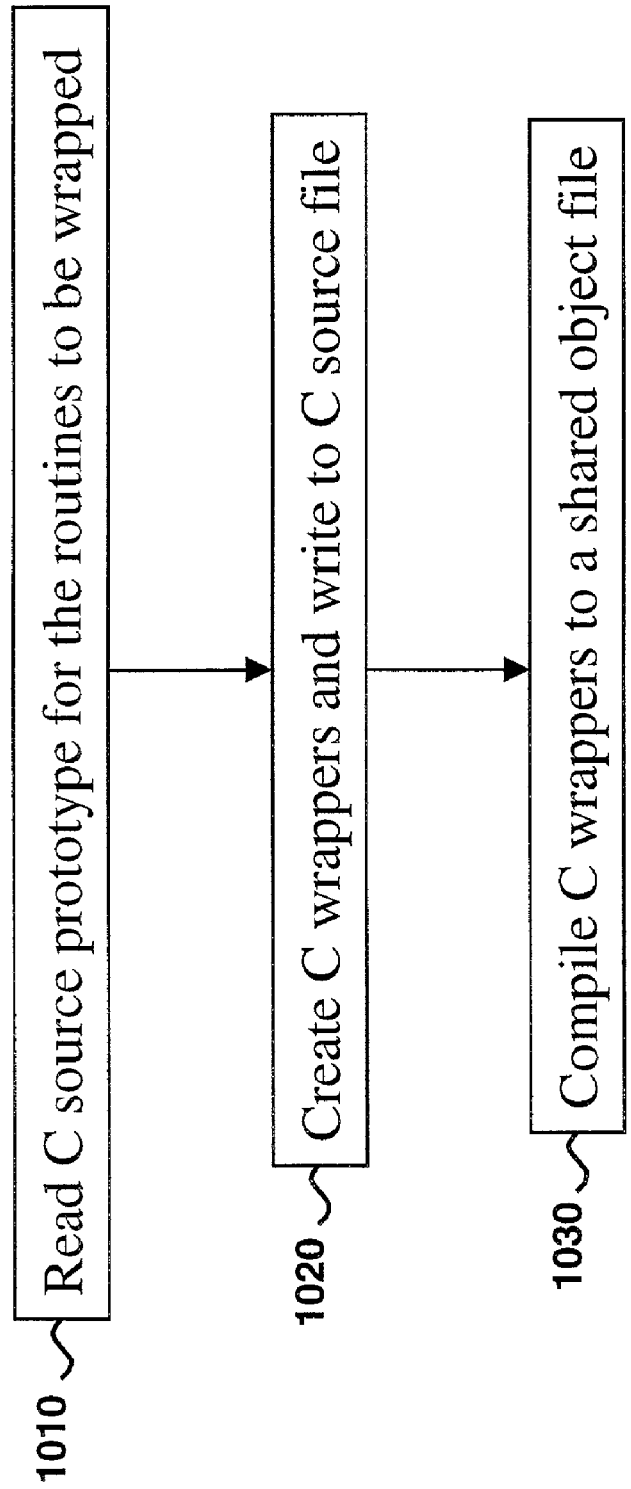
FIG. 10 illustrates creating and compiling a wrapper.

In order to allow simulator code to call compiled C routines as if they were simulator code, "import" C wrapper routines are used. Wrappers move data between the simulator stack and the compiler stack. Such wrappers are coded manually using prior art such as PLI, but the blending simulator creates them automatically. The blending simulator creates these wrappers from the C source prototype. FIG. 10 shows the steps involved in producing C programming language wrappers in the blending simulator. Step 1010 reads the C source program prototype for the routines to be wrapped. Step 1020 creates C wrappers and writes them into C source files. Step 1030 compiles the C wrappers to a shared object file.

Similarly, in order to allow compiled application routines to call simulator code, "export" C wrapper routines are written by the blending simulator in order to move data. Even if the caller and called are both compiled, a wrapper may be needed to change the data type or representation. This applies in particular to Verilog and C. Such wrappers are automatically provided by the blending simulator.

Verilog tasks can have 'output' or 'inout' arguments. Similarly, VHDL procedures can have 'out' or 'inout' arguments. Some programming languages, such as C, do not have built-in support for such arguments. Such arguments may be implemented in C by using pointers to the variables. The blending simulator wrapper automatically creates a temporary copy of the arguments and a pointer to it.

For debugging purposes, the automatically generated wrappers can include statements to print out the arguments of the tasks and routines as they are called and the wrapper can include statements to print out the return values of functions. This printing of arguments and return values provides automatic tracing of the inter-language calling and returning.

Compile and Link Process

The programming language tasks and functions can be compiled into object (file extension .o) files, and then linked into shared object (file extension so) files. The act of referencing a compiled C routine or variable in the HDL requires that the routine or variable be made visible to the HDL; this is an "import" process. The act of referencing an HDL function or task from a compiled programming language requires that the function or task be made visible to the programming language; this is an "export" process.

Figure 11:
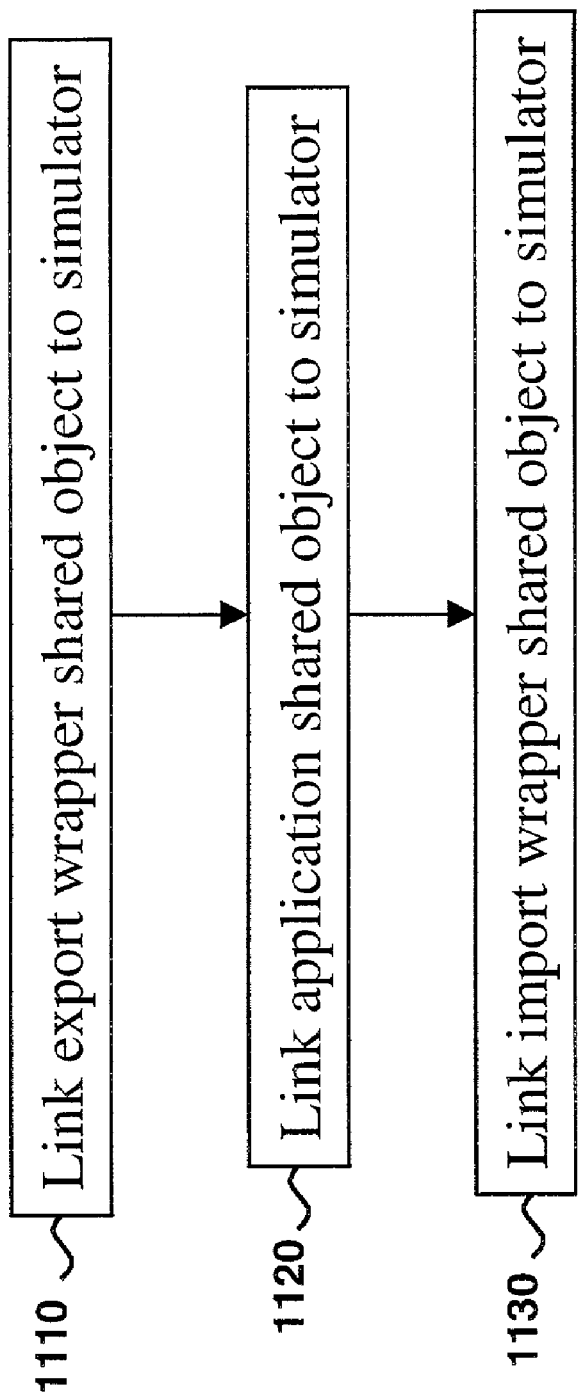
FIG. 11 shows the sequence of linking wrappers and application code.

When a simulation using a mixture of imported and exported programming language items is run, the blending simulator automatically links the shared object code in the order shown in FIG. 11. Step 1110 links the export wrapper shared object to the simulator. Step 1120 links the application shared object to the simulator. Step 1130 links the import wrapper shared object to the simulator. The link order is very important to avoid references to undefined symbols: the export wrapper refers to symbols in the main simulation executable; the programming language shared objects refer to routines in the export wrapper; and the import wrapper refers to symbols in the main simulation executable and the application shared objects.

In order to create wrapper functions, a file must describe the function to be wrapped in a programming language form, such as a C header file. The automatic blending simulator wrapper creation process verifies that the programming language description conforms to the function or task description in the HDL.

HDL Calling Programming Language Routine

In the blending simulator, calls which may involve a time duration are identified by language constructs, such as:

import "C" task

Figure 12:
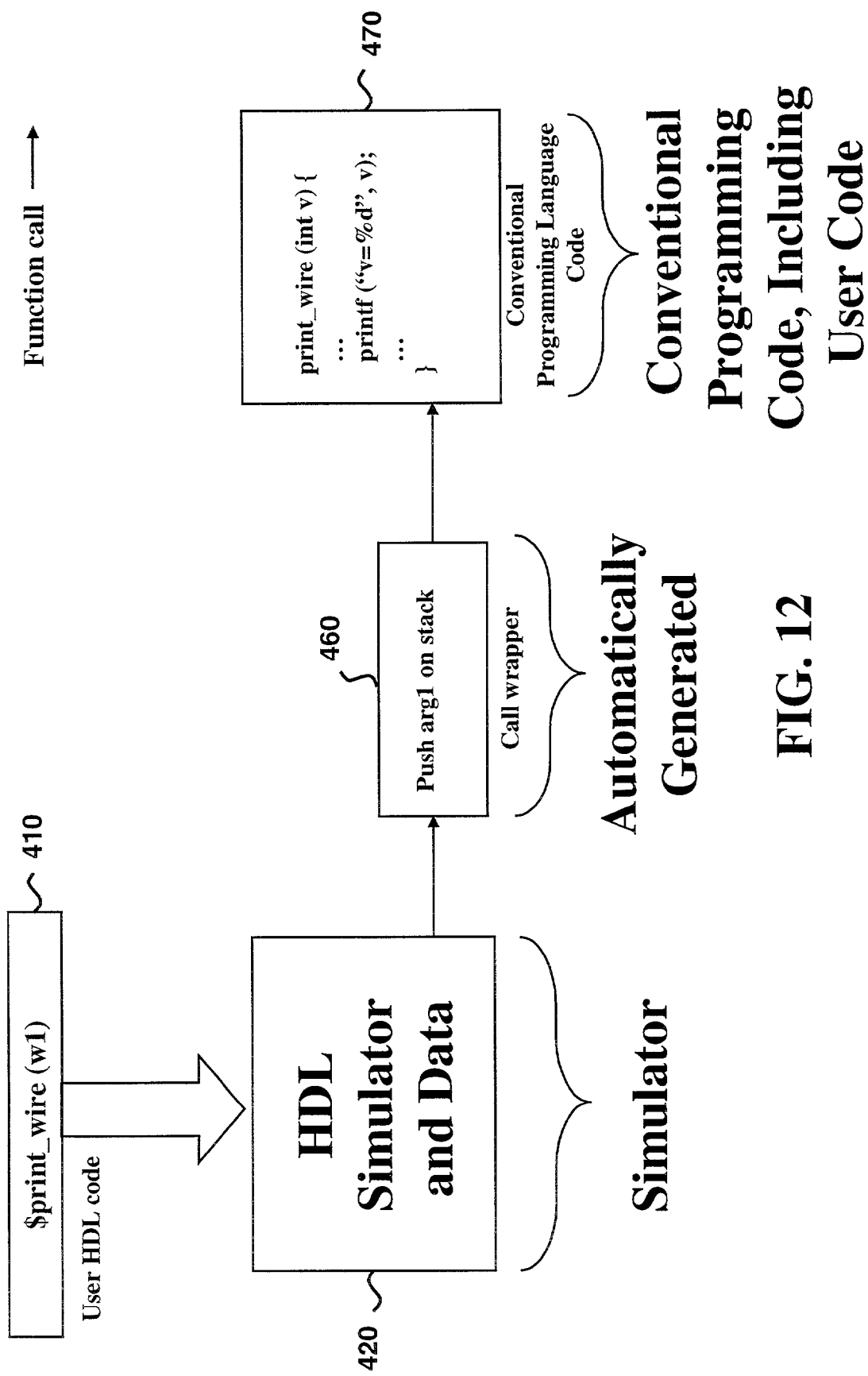
FIG. 12 shows HDL calling a programming language function and passing arguments in the blending simulator of the invention.

Programming language routines may involve a time duration either because they contain calls back to the HDL and the reply takes time to respond or because they directly call a 'wait' routine in the simulator. For both functions and tasks the blending simulator automatically converts the argument and return data types from one language to the closest corresponding types in the other language. FIG. 4 has an appropriate structure for outlining examples of code-related data flowing between the various parts of the blending simulator, and various drawings to follow will be derived from FIG. 4. For illustrative purposes, FIG. 12 is derived from FIG. 4, and retains the original element numbering of FIG. 4. In FIG. 12, the user HDL Code 410 contains, for example, the Verilog command $print-wire(w1). This command passes through the HDL simulator and data subsystem 420 and enters the task or function call wrapper subsystem 460, which pushes an appropriate argument 'arg1' onto the stack. The task or function call wrapper subsystem 460 then creates an equivalent program segment in the conventional programming language, such as C, which runs in the user application code subsystem 470.

HDL Calls to Shared Object Routines

The blending simulator has the ability to automatically link to shared object code and to automatically generate, compile and link a routine that formats the arguments from the HDL call in accordance with the host machine calling protocol for the language, and converts the return value to an HDL data type. This routine is termed a 'wrapper', because it only re-packages another routine. Furthermore a task written in the programming language can be declared an 'import task' to the blending simulator and this will automatically invoke a threads package to provide concurrency for the object code.

Importing Compiled Functions

Figure 13:
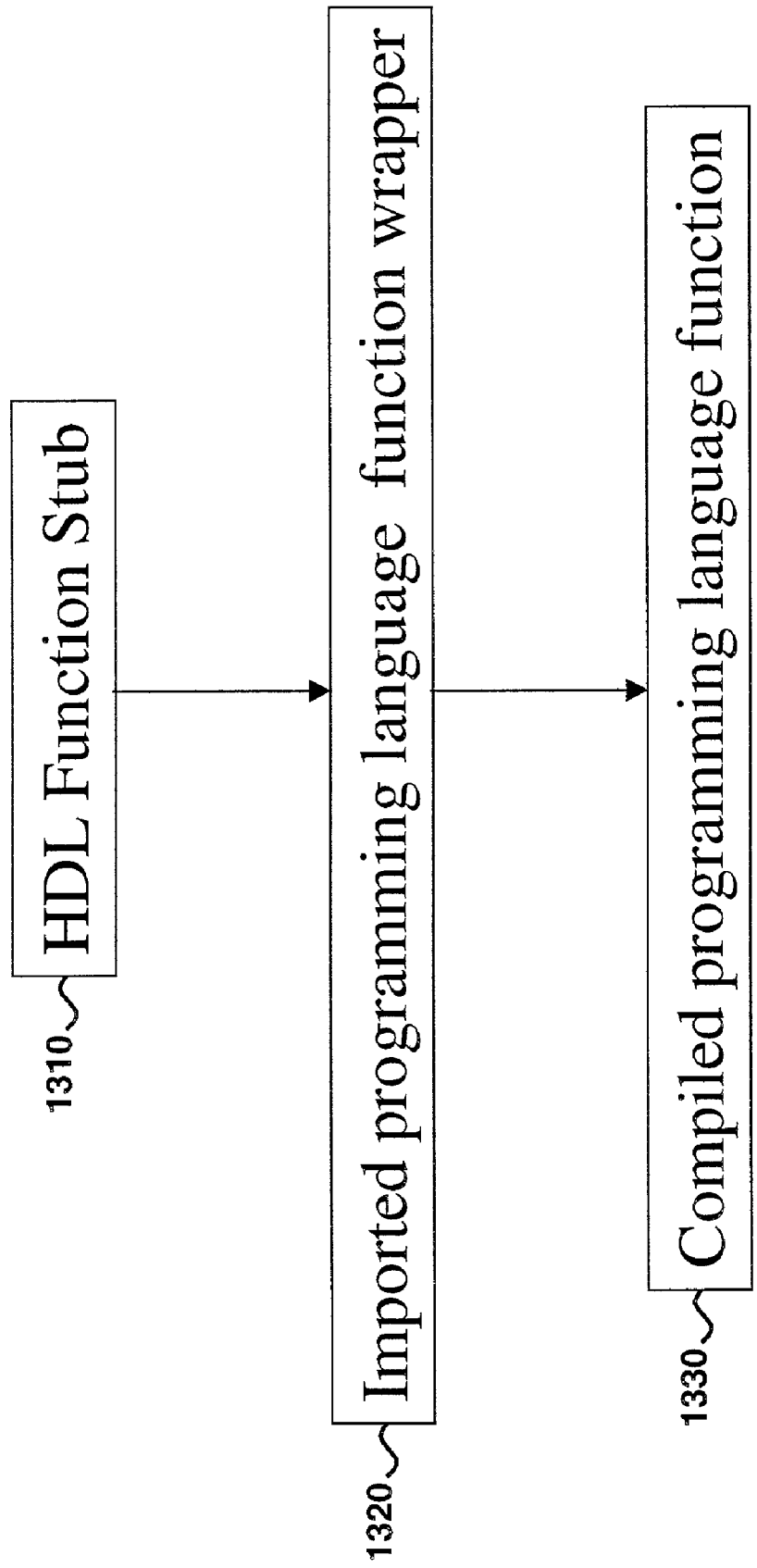
FIG. 13 shows the sequence for HDL calling imported compiled functions.

FIG. 13 illustrates the sequence for calling a compiled programming language function from HDL. It starts with an HDL function stub 1310 representing the function in the form used by the blending simulator. This calls the imported programming language function wrapper 1320. This in turn calls the compiled programming language function 1330, which returns to the wrapper 1320 and back to the stub 1310.

The wrapper function source file comprises:
1) A declaration section, which declares the programming language types, needed for the function to be wrapped and the wrapped function prototype itself; and
2) The wrapper function definition.

The wrapper function comprises:
1) Local variables used to pass parameters to the wrapped function;
2) Calls to simulator routines to pop values from the simulator expression stack into the locals with the option of printing the values for automatic tracing;
3) The call to the wrapped function itself; and
4) A call to a simulator routine to push the function result onto the simulator expression stack with the option of printing the function result for automatic tracing.

The imported programming language function wrapper performs various actions:
1. It removes function arguments from the simulator evaluation stack;
2. It calls the compiled programming language function passing the arguments recovered; and
3. It pushes any function result onto the evaluation stack.

To access the simulator evaluation stack, the wrapper function calls routines defined in the main simulation executable. For example, a wrapper for a C function that takes and returns an 'int' might be coded:

```
void sl_wrap_userFunc(void) {
    int sl_result;
    int sl_arg0;
    slEvalPop((void *)(&sl_arg0), 4);           /* 1 */
    sl_result = ((int (*) (int))(0x40334304))(sl_arg0);   /* 2 */
    slEvalPush((void *)(&sl_result), 4);        /* 3 */
}
```

Line /* 1 */ implements argument removal from the evaluation stack.

Line /* 2 */ is the call to the imported C function. The actual function address (0x40334304 in this case) is found by symbol lookup in the C linked shared objects.

Line /* 3 */ implements the function result push onto the evaluation stack.

Function conformance

For imported C functions, the source data items are coded:
1. C function prototype in a .h file supplied on the command line, e.g.:
int userFunc(int);
2. HDL import line, e.g.:
import "C" function int userFunc(int);
Omitting the import directive is allowed so that legacy HDL designs may use the blending simulator without the need for any additional code. For imported C functions declared with an import directive, the C prototype and the optional import directive prototype must conform.

Import Function Wrapper Example

Suppose that a wrapper function needs to be automatically created to call this function:
/* Example function using user-defined type */
typedef struct myTypeS {double a; int b} myType;
int myFunc(int a, myType b);
In this case, the automatic wrapper would be coded:

```
/* 1. DEFINITION SECTION */
typedef struct myTypeS {double a; int b} myType;
int myFunc(int a, myType b);
/*2 WRAPPER FUNCTION SECTION */
void wrap_myFunc(void) {
/* 2.1 local variables */
int arg1; // for first parameter
myType arg2; // for second parameter
int result; // for function result
/* 2.2 argument pop */
slEvalPop(&arg1, 4); // pop arg 1 (4 bytes) from simulator expression stack
slEvalPop(&arg2, 12); // pop arg 2 (12 bytes) from simulator expression stack
/* 2.3 call wrapped function */
result = myFunc(arg1, arg2);
/* 2.4 result push */
slEvalPush(&result, 4); // push result (4 bytes) onto simulator expression stack
}
```

Importing Compiled Tasks

Figure 14:
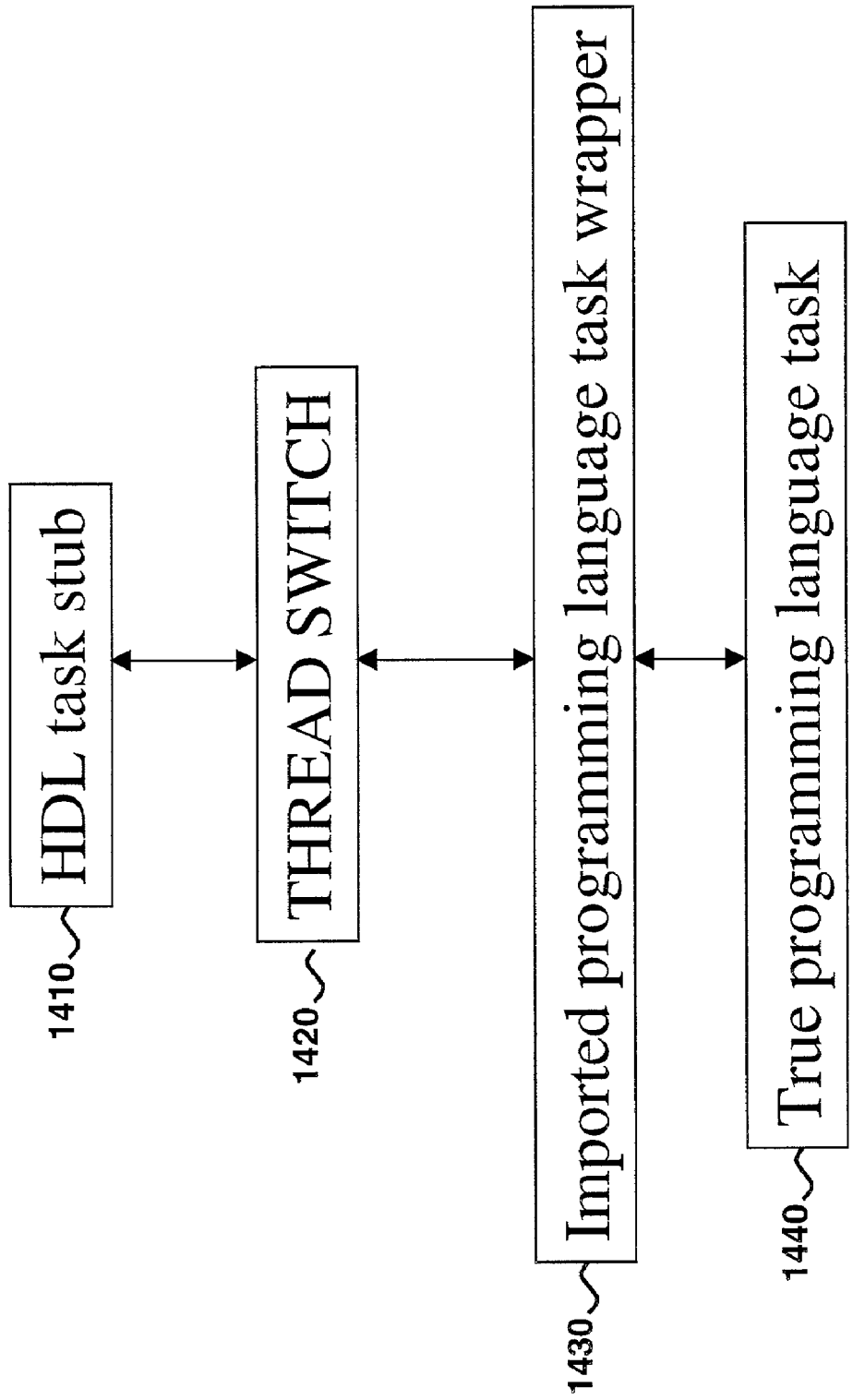
FIG. 14 shows the sequence for HDL calling imported compiled tasks.

FIG. 14 illustrates the sequence for calling a compiled programming language task from HDL. It starts with the HDL task stub 1410 which invokes a new thread in 1420. This calls the imported programming language task wrapper 1430. Step 1440 performs the true programming language task, returns to the wrapper 1430, switches back the original thread and returns to the stub 1410.

The HDL task stub 1410 represents the task in the form used by the blending simulator.

When called, it performs these actions:
1. It creates a new thread in which the programming language task wrapper is called;
2. It schedules the new thread to start immediately; and
3. It suspends the current (simulator) thread.

At this point 1420, the task thread starts to run, executing the imported task wrapper 1430.

The imported task wrapper performs these actions:
4. It removes task arguments from the simulator evaluation stack with the option of printing their values for automatic tracing;
5. It calls the true programming language task 1440, passing the arguments recovered; and
6. It pushes the value of any output or inout task arguments onto the simulator evaluation stack with the option of printing their values for automatic tracing. See notes below for function conformance for more information about this.

When the task wrapper 1430 exits, control is passed back 1420 to the main simulation thread as follows:
7. The task thread schedules an immediate restart of the simulation thread;
8. The task thread deletes itself and exits;

At this point, the main simulation thread restarts execution in the stub 1410.

Programming language tasks may call functions and tasks implemented in HDL. This is covered in following sections for exported functions and tasks.

A wrapper for a C task taking an input int argument and an inout double argument might be coded:

```
void sl_wrap_userTask(void) {
    int sl_arg1;
    double sl_arg2;
    slEvalPop((void *)(&sl_arg1), 4);          /* 1 */
    slEvalPop((void *)(&sl_arg2), 8);          /* 1 */
    ((void (*) (int ,double *))(0x40334238))(sl_arg1,   /* 2 */
        &sl_arg2);
    slEvalPush((void *)(&sl_arg2), 8);         /* 3 */
}
```

The lines commented /* 1 */ implement argument removal from the evaluation stack.

The line commented /* 2 */ is the call to the imported C function. Note that INPUT parameters are passed by value to the called function whereas INOUT and OUTPUT parameters are passed by reference. This is so that the underlying C function can modify the value of these arguments.

The line commented /* 3 */ pushes the inout arguments onto the evaluation stack when the task completes.

Function Conformance

For imported C tasks, two source data items are required. These items are:
1. C function prototype in a .h file supplied on the command line, e.g.:
   void userTask(int, double*);

2. HDL import line, e.g.:
   import "C" task userTask(input int, inout double);

The rules for matching prototypes for C tasks are:
1. The C task prototype must always be a void-valued function;
2. Any arguments that are INOUT or OUTPUT must be declared as POINTERS in the C function prototype.

Task Wrapper Example

Suppose that the HDL definition of a C task is:
   task myTask(input int a, inout int b);

Then the corresponding compiled C function must be declared as:
   void myTask(int a, int *b);

The wrapper code that is automatically created is:

```
/* 1. DEFINITION SECTION */
void myTask(int a, int *b);
/* 2. WRAPPER FUNCTION SECTION */
void wrap__myTask(void) {
    /* 2.1 local variables */
    int arg1; // for first parameter
    int arg2; // for second parameter
    /* 2.2 argument pop */
    slEvalPop(&arg1, 4); // pop arg 1 (4 bytes) from simulator expression stack
    slEvalPop(&arg2, 4); // pop arg 2 (4 bytes) from simulator expression stack
    /* 2.3 call wrapped function - note POINTER to second argument */
    myTask(arg1, &arg2);
    /* 2.4 output argument push */
    slEvalPush(&arg2, 4); // push arg 2 (4 bytes) onto simulator expression stack
}
```

Programming Language Calls HDL

If the HDL code contains a wait construct, the simulator must 'thread' the programming language code. This means that it must save its state, and restore that state when the wait has elapsed and the HDL task has returned. Whether or not the code contains a wait, the blending simulator automatically converts the argument and return data types from one language to the closest corresponding types in the other language.

Interpreted Programming Language Call to HDL

The blending simulator has the ability to allow an interpreted programming language to call an HDL task or function. All that the user needs to supply in addition is an 'export' declaration and a C routine prototype or equivalent.

Shared Object Call to HDL

The blending simulator has the ability to link a shared object that calls an HDL task or function. All that the user needs to supply in addition is an 'export' declaration and a C routine prototype or equivalent.

Exporting HDL Functions

Figure 15:
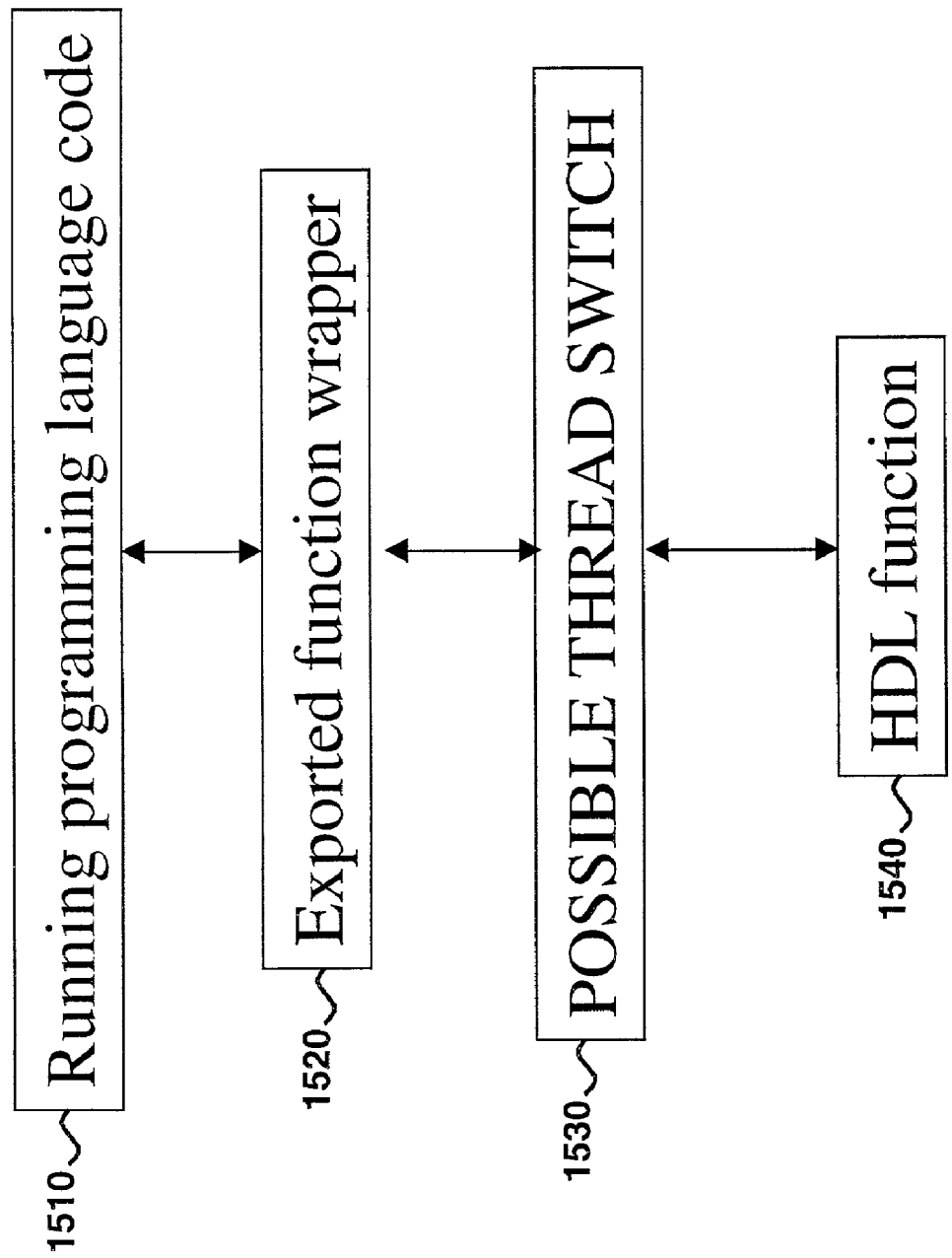
FIG. 15 shows the sequence for a programming language calling exported HDL functions.

FIG. 15 illustrates the sequence for calling an HDL function from a programming language. The blending simulator automatically generates wrappers that provide automatic threading to enable compiled application code to call tasks in the HDL. Step 1510 runs the programming language code. This calls the exported function wrapper 1520. Step 1530 determines whether there is a possible thread switch. Step 1540 runs the HDL function. If there was a thread switch, the old thread must be restored in step 1530. The wrapper 1520 then returns to the code 1510.

The exported function wrapper of step 1520 performs three actions:
1. It pushes any function arguments onto the evaluation stack with the option of printing their values for automatic tracing.
2. It calls the HDL function.
3. It pops any function result from the evaluation stack with the option of printing its value for automatic tracing and returns it.

A wrapper for an exported HDL function taking and returning an int might be coded:

```
int HDLFunc (int sl_arg0) {
    int sl_result;
    slEvalPush((void *)(&sl_arg0), 4);      /* 1 */
    slEvalCallSim((void*)0x4013c30c);       /* 2 */
    slEvalPop((void *)(&sl_result), 4);     /* 3 */
    return sl_result;
}
```

The line commented /* 1* / pushes the function argument onto the simulator evaluation stack.

The line commented /* 2* / is the call to the exported function. The actual function address (0x4013c30c in this case) is the address of the HDL function description.

The line commented /* 3 */ pops the function return value from the evaluation stack.

It is illegal for an imported programming language function to call an exported HDL task (for the reason that the task might block). Because the programming language code is separately compiled using a normal compiler, there is no way to verify this restriction is observed before simulation starts. Therefore, an automatic check is made at run time in the slEvalCallSim callback. This function is able to determine from static data associated with the calling process whether the process is running in the simulator main thread (i.e., it was imported as a function) or whether it is running in a separate thread (i.e. it was imported as a task). If an exported task is being called from an imported function, the blending simulator gives an error message and the simulation terminates immediately.

The slEvalCallSim callback performs different actions if the calling process is a programming language function rather than if the process is a programming language task. If called from a function, the matching HDL function is called immediately. If called from a task, the main simulation thread is scheduled for immediate restart and the current thread is suspended.

When the called HDL function completes execution, there are again two actions depending on whether the function was called from a programming language function or task. If called from a function, the matching HDL function returns immediately. If called from a task, the task thread is scheduled for immediate restart and the current thread is suspended.

Function Conformance, Exported HDL Function

For exported HDL functions, two source data items are always required. These items are, for example:
1. C function prototype in a .h file supplied on the command line, e.g.:
   extern int HDLFunc(int);
2. HDL export line, e.g.:
   export "C" function HDLFunc;

The function "HDLFunc" must of course be defined in an HDL source file.

When exporting functions to a programming language, the function prototypes must match subject to the data type conversion rules. For example, it is legal for a parameter declared as "int" in C to be matched with one declared as "integer" in Verilog. Therefore, the above export could successfully be used with:
    function integer HDLFunc(integer arg1);

Exporting HDL Tasks

Figure 16:
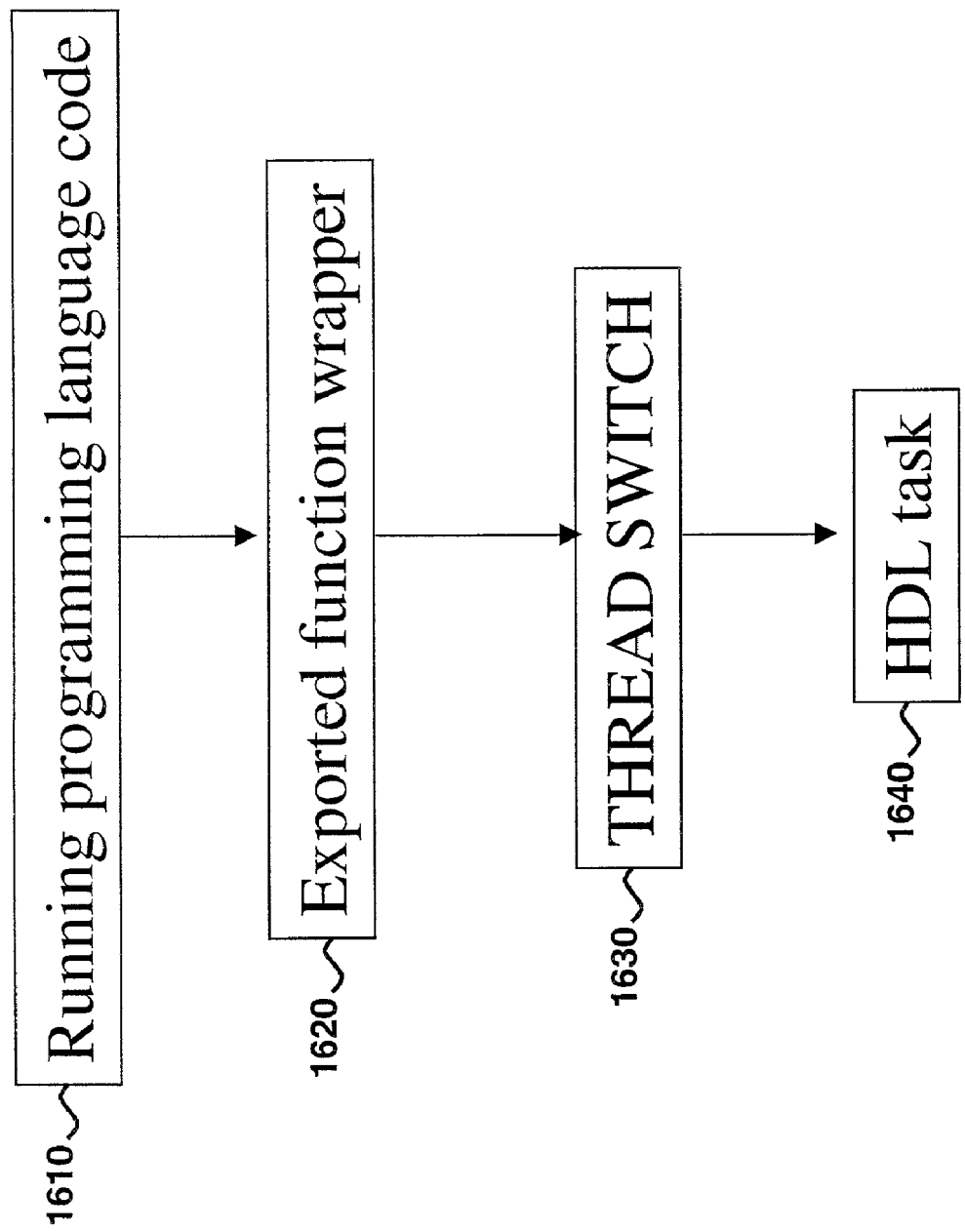
FIG. 16 shows the sequence for a programming language calling exported HDL tasks.

FIG. 16 illustrates the sequence for calling an HDL task from a conventional programming language. The steps for calling a task are very similar to the steps of FIG. 15 for calling a function. Step 1610 runs the programming language code. This calls the exported function wrapper in step 1620. Step 1630 performs a thread switch. Step 1640 runs the HDL task. When the task returns, the old thread is switched back 1630 and then the wrapper 1620 returns to the code 1610.

The exported task wrapper performs these actions:
1. It pushes any task INPUT or INOUT arguments onto the evaluation stack with the option of printing their values to provide automatic tracing;
2. It calls the HDL task; and
3. It pops any task INOUT or OUTPUT arguments with the option of printing their values to provide automatic tracing and assigns them to the matching programming language parameters (if they are passed by reference)

A wrapper for an exported HDL task with an int input parameter followed by and int output parameter might be coded:

```
void HDLTask(int sl_arg0, int *sl_arg1) {
    slEvalPush((void *)(&sl_arg0), 4);      /* 1 */
    slEvalCallSim((void*)0x4013c30c);       /* 2 */
    slEvalPop((void *)(sl_arg1), 4);        /* 3 */
}
```

The line commented /* 1* / pushes the task input argument onto the simulator evaluation stack.

The line commented /* 2 */ is the call to the exported task.

The line commented /* 3* / pops the task output argument from the evaluation stack.

Although the same function is used to call the exported task as is used for exported functions (slEvalCallSim), a thread switch is always required when this call takes place.

Function Conformance, Exported HDL Task

For exported HDL tasks, two source data items are always required. These items are, for example:
1. C function prototype in a .h file supplied on the command line, e.g.:
   extern void HDLTask(int, int*);
2: HDL export line, e.g.:
   export "C" task HDLTask;

The task "HDLTask" must of course be defined in an HDL source file.

As described previously, task parameters that are INOUT or OUTPUT must be declared using POINTERS in the C prototype, and task parameter types must match subject to the type conversion rules so that arguments declared as integer in Verilog will match arguments declared as int in C, for example.

HDL Access to Programming Language Variables

The blending simulator has the ability to make a programming language variable accessible to the HDL code so that it can be shared. All that the user needs to supply in addition is an 'import' declaration for the HDL and a C 'extern' declaration or equivalent.

Figure 17:
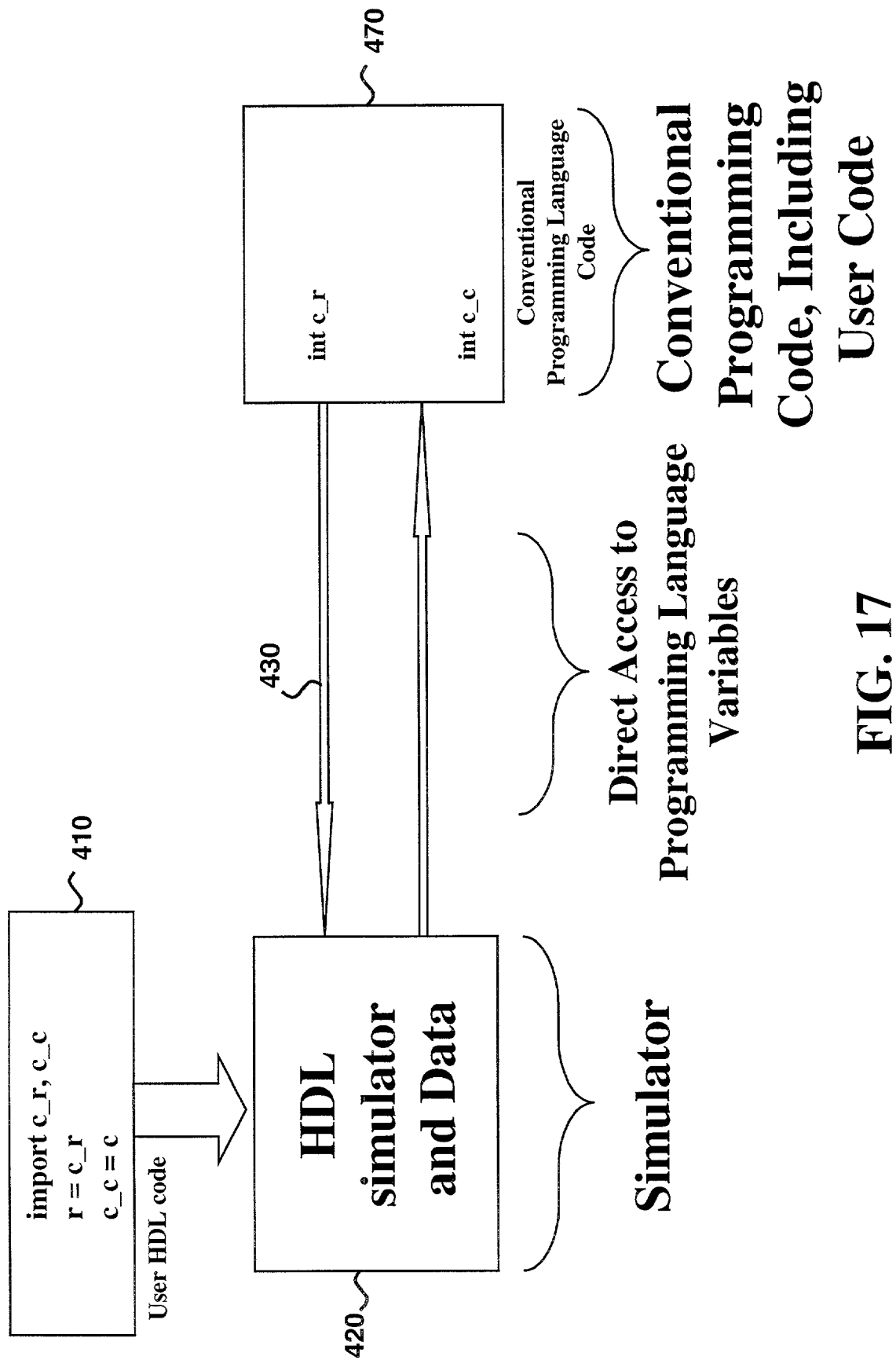
FIG. 17 illustrates an HDL accessing programming language variables in the blending simulator.

The blending simulator reads a declaration of the name and type of each variable. The blending simulator automatically converts the data types from the programming language to the HDL for reading, and from the HDL to the programming language for writing. This means that the variable is shared between the two languages, as shown in FIG. 17 which is derived from, and retains the element numbers of, FIG. 4 and illustrates variable sharing between Verilog and the C language. The user HDL code 410 is able to import variables from the C user code 470 through the direct access means 430 and the HDL simulator and data subsystem.

Programming Language Access to HDL Variables

The blending simulator has the ability to make an HDL variable accessible to the application code so that it can be shared. All that the user needs to supply in addition is an 'export' declaration and a C 'extern' declaration or equivalent. The blending simulator also provides routines for reading and writing HDL variables from the programming language. These routines convert the data type by the usual type mapping. Such routines can be packaged in a class library to make calling from languages like C++ or PERL easier.

Other Blending Simulator Features

Figure 18:
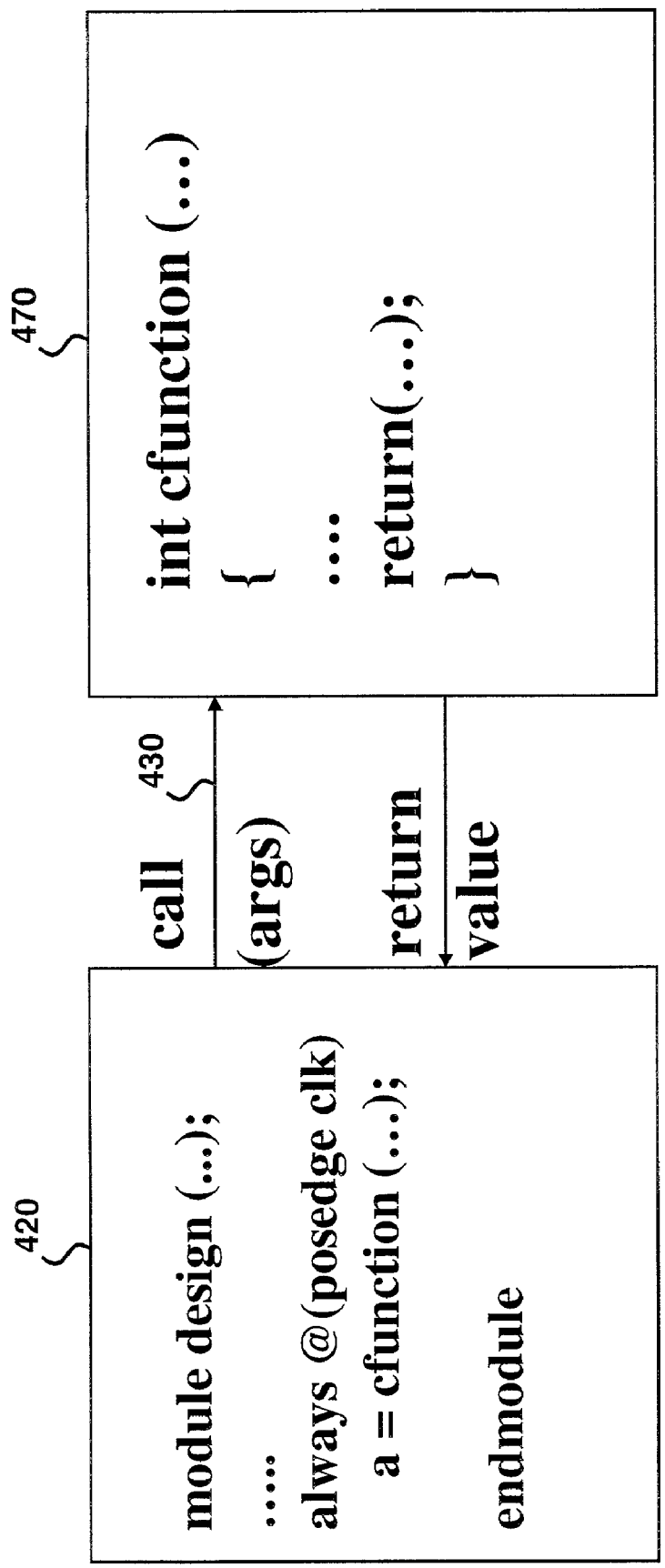
FIG. 18 illustrates an HDL (Verilog) calling a function written in a programming language (C)

The blending simulator allows HDL code to access software libraries, written in a programming language, such as operating system utilities for reading from, or writing to, files or other programs, graphics utilities for displaying pictures or math libraries for calculating trigonometric functions or for solving equations. The standard library may need to be supplemented with user-written code. FIG. 18 illustrates an example of an HDL (Verilog) calling a software function written in a programming language (C). A call and return path is formed from the HDL simulator and data subsystem 420 through the direct access means 430 to the library routine contained in the conventional programming code section 470. The call and return occur in a single HDL simulator time step.

The blending simulator also facilitates testbench modeling. A testbench verifies a hardware design by applying stimuli and checking responses. A data packet, such as may be used in a computer network, usually consists of a header and a payload. The header may contain numbers indicating the origin and destination addresses, for example. In the case of hardware that processes data packets, stimulus data packets are often generated algorithmically, e.g. with a pseudo-random number generator for the payload. This is the time-independent view used by a conventional programming language. The packets may be sent over a network one bit after another, in which case there is also a time-dependent view, a waveform that lasts for a given time.

Figure 19:
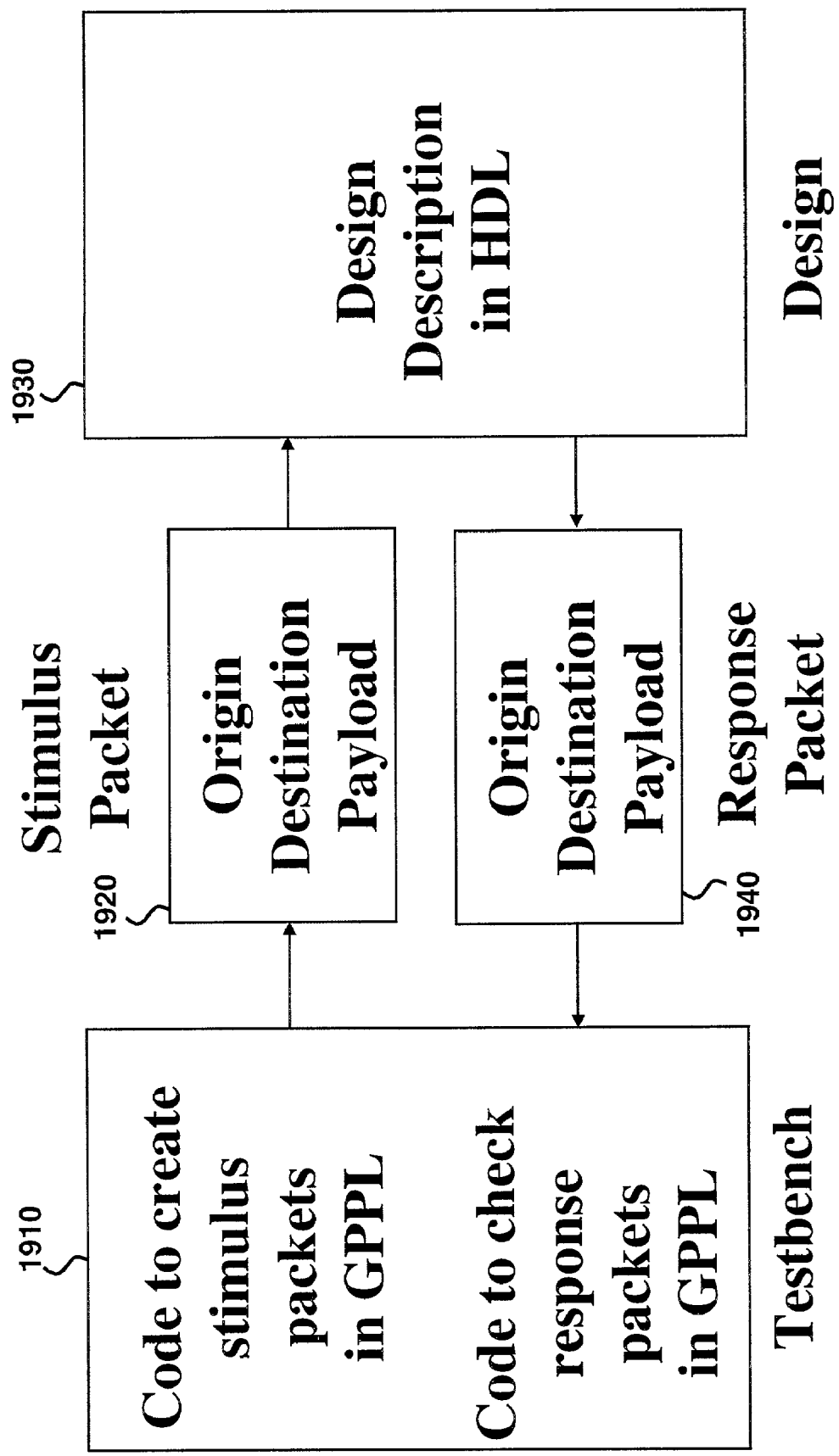
FIG. 19 illustrates a testbench written in a programming language applying stimulus packets and checking response packets to verify a design written in HDL.

FIG. 19 illustrates a testbench applying stimulus packets and checking response packets. The stimulus generation code in the testbench 1910 issues a stimulus packet 1920 and must usually wait for the simulation of the design 1930 to proceed and produce the response packet 1940 before generating the next stimulus packet 1920.

Notwithstanding that the invention has been disclosed in terms of its preferred embodiment, persons skilled in the art will appreciate that the embodiment could be modified. For example, the invention could be applied to the blending of HDL and verification languages, or to the blending of verification languages and programming languages. Accordingly, the invention, to the extent of any such variations, is intended to be covered in interpreting the scope of the following claims.

We claim:

1. A computer-readable storage medium storing instructions that when executed by a computer cause the computer to perform a method to facilitate simulating a digital circuit, the method comprising:
   receiving a description of the digital circuit, wherein a first portion of the description is in a hardware description language and a second portion of the description is in a computer programming language,
   blending the first portion and the second portion into an executable simulation, wherein blending the first portion and the second portion involves automatically creating a wrapper for code written in the computer programming language so that code written in the hardware description language can call code written in the computer programming language, and wherein the wrapper facilitates automatic threading, whereby automatic threading enables the executable simulation to directly call tasks in the hardware description language; and
   executing the executable simulation, wherein executing the executable simulation allows a designer to simulate operation of the digital circuit.

2. The computer-readable storage medium of claim 1, wherein blending the first portion and the second portion involves mapping data types native to the hardware description language to data types native to the computer programming language.

3. The computer-readable storage medium of claim 1, wherein the wrapper provides data communication mechanisms between code written in the hardware description language and code written in the computer programming language, wherein the data communication mechanisms provide mapping between types in the hardware description language and the computer programming language.

4. The computer-readable storage medium of claim 1, wherein the wrapper is automatically generated.

5. The computer-readable storage medium of claim 1, wherein the wrapper can output a message upon an occurrence of a call and a return, wherein the message can include values associated with the call and the return.

6. An apparatus to facilitate simulating a digital circuit, comprising:
   a receiving mechanism configured to receive a description of the digital circuit, wherein a first portion of the description is in a hardware description language and a second portion of the description is in a computer programming language,
   a blending mechanism configured to blend the first portion and the second portion into an executable simulation;
   a creating mechanism configured to automatically create a wrapper for code written in the computer programming language so that code written in the hardware description language can call code written in the computer programming language, wherein the wrapper facilitates automatic threading, whereby automatic threading enables the executable simulation to directly call tasks in the hardware description language; and
   an executing mechanism configured to execute the executable simulation, wherein executing the executable simulation allows a designer to simulate operation of the digital circuit.

7. The apparatus of claim 6, further comprising a mapping mechanism configured to map data types native to the hardware description language to data types native to the computer programming language.

8. The apparatus of claim 6, further comprising a data communication mechanism configured to communicate between code written in the hardware description language and code written in the computer programming language, wherein the data communication mechanism provides mapping between types in the hardware description language and the computer programming language.

9. The apparatus of claim 6, wherein the wrapper is automatically generated.

10. The apparatus of claim 6, wherein the wrapper can output a message upon an occurrence of a call and a return, wherein the message can include values associated with the call and the return.

* * * * *